(12) United States Patent
Muramatsu et al.

(10) Patent No.: US 6,326,610 B1
(45) Date of Patent: Dec. 4, 2001

(54) OPTICAL SENSOR INCLUDING TEMPERATURE CONTROL

(75) Inventors: Satoru Muramatsu; Hidetaka Suzuki, both of Hamamatsu (JP)

(73) Assignee: Hamamatsu Photonics K.K., Shizuoka-Ken (JP)

( * ) Notice: Subject to any disclaimer, the term of this patent is extended or adjusted under 35 U.S.C. 154(b) by 0 days.

(21) Appl. No.: 09/309,277

(22) Filed: May 11, 1999

(30) Foreign Application Priority Data

May 11, 1998 (JP) .................................................. 10-127611

(51) Int. Cl.[7] ........................................................ H01J 7/24
(52) U.S. Cl. ............................. 250/238; 62/3.7; 136/203; 165/104.33; 257/930
(58) Field of Search ................................ 250/238, 208.1, 250/214.1, 214 VT; 62/3.2, 3.3, 3.7; 136/203, 204; 372/34, 36; 165/104.33; 257/930, 432; 313/11; 361/701, 702, 717

(56) References Cited

U.S. PATENT DOCUMENTS 5,385,020 * 1/1995 Gwilliam et al. ........................ 62/3.7
5,515,683 * 5/1996 Kessler .................................... 62/3.7

FOREIGN PATENT DOCUMENTS 9-219475  8/1997 (JP) .

* cited by examiner

Primary Examiner—Que T. Le
Assistant Examiner—Thanh X. Luu
(74) Attorney, Agent, or Firm—Pillsbury Winthrop LLP

(57) ABSTRACT

A first Peltier device Pe1 and at least one second Peltier device Pe2 having a current consumption smaller than that of the first Peltier device Pe1 are connected to each other in series, while a bypass circuit B for diverting an excess current I3 with respect to the second Peltier device Pe2 is connected to the second Peltier device Pe2 in parallel, so that a driving current I1 from a current control section A drives the first Peltier device Pe1 at its optimum operating point, and the excess current I3 with respect to the second Peltier device Pe2 in the driving current I1 is diverted into the bypass circuit B, so as to allow the second Peltier device Pe2 to be driven at its optimum operating point as well, where by the cooling efficiency can be improved. Also, the first and second Peltier devices Pe1, Pe2 are stacked on each other, while all the Peltier devices Pe1, Pe2 are driven by the single common current control section A, so as to attain a smaller size.

2 Claims, 3 Drawing Sheets

OPTICAL SENSOR INCLUDING TEMPERATURE CONTROL

BACKGROUND OF THE INVENTION

1. Field of the Invention

The present invention relates to an optical sensor having a multistage type thermoelectric cooling section.

2. Related Background Art

For example, in a CCD image sensor or the like, a number of photosensors, such as photodiodes, for example, are arranged in parallel as a photosensitive section, whereas the photosensors are provided with a thermoelectric cooling section for cooling the photosensors. As the thermoelectric cooling section, there has been known the one in which Peltier devices are stacked on each other in a plurality of stages for effecting forcible air cooling.

In the thermoelectric cooling section in which Peltier devices are stacked on each other in a plurality of stages, it is necessary that, in order to improve the heat radiation efficiency, a Peltier device having a higher output (greater current consumption) than that of a Peltier device on the heat absorption side nearer the photosensors is disposed on the heat radiation side. Consequently, Peltier devices having different output characteristics [I (current)-V (voltage) characteristics] are disposed on the heat absorption side and the heat radiation side, respectively.

When the Peltier devices having different output characteristics are thus stacked on each other, it is necessary for each Peltier device to operate at its optimum operating point, i.e., the point where the cooling performance of the Peltier device is maximized with respect to its consumed power, in order to exhibit the characteristics of the individual Peltier devices at maximum.

For this reason, the individual Peltier devices have conventionally been driven at their optimum operating points by their respective power sources independent from each other.

SUMMARY OF THE INVENTION

When the above-mentioned individual Peltier devices are driven by power sources independent from each other, as mentioned above, while the cooling efficiency is excellent since each Peltier device can be driven at its optimum operating point, there is such a problem that the apparatus has a larger size since the power sources are needed by the number corresponding to that of Peltier devices.

On the other hand, when the individual Peltier devices are driven by a single common power source, there is such a problem that only one of the Peltier devices can operate at its optimum operating point.

In order to overcome such problems, it is an object of the present invention to provide an optical sensor which can reduce its size and improve its cooling efficiency.

The optical sensor in accordance with the present invention is an optical sensor comprising: a temperature sensor; a current control section; a thermoelectric cooling section; and a bypass circuit, said temperature sensor being disposed in said optical sensor, said current control section supplying a driving current to said thermoelectric cooling section according to an output of said temperature sensor, said thermoelectric cooling section being constituted by a multistage structure in which a first Peltier device on a heat radiation side, and a second Peltier device, on a heat absorption side, having a current consumption lower than that of said first Peltier device are stacked on each other, and said Peltier devices being electrically connected to each other in series and being driven by the driving current from said current control section, and said bypass circuit being connected to said second Peltier device in parallel, and diverting an excess current with respect to said second Peltier device.

In the optical sensor in accordance with the present invention, since the first Peltier device on the heat radiation side and at least one second Peltier device, on the heat absorption side, having a current consumption lower than that of the first Peltier device, are connected to each other in series, while a bypass circuit for diverting an excess current with respect to the second Peltier device is connected to the second Peltier device in parallel, the first Peltier device is driven at its optimum operating point (the point at which the cooling performance of the Peltier device is maximized with respect to its consumed power) by the driving current from the current control section, and the excess current with respect to the second Peltier device is diverted into the bypass circuit, whereby the second Peltier device can also be driven at its optimum operating point. Consequently, the cooling efficiency can be improved. Also, since the first and second Peltier devices are stacked on each other while all the Peltier devices are driven by a single common power source (current control section), a smaller size can be attained.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

In the following, modes for carrying out the present invention will be explained in detail. Among the drawings, constituents identical to each other will be referred to with numerals or letters identical to each other, without repeating their overlapping explanations.

Figure 1:
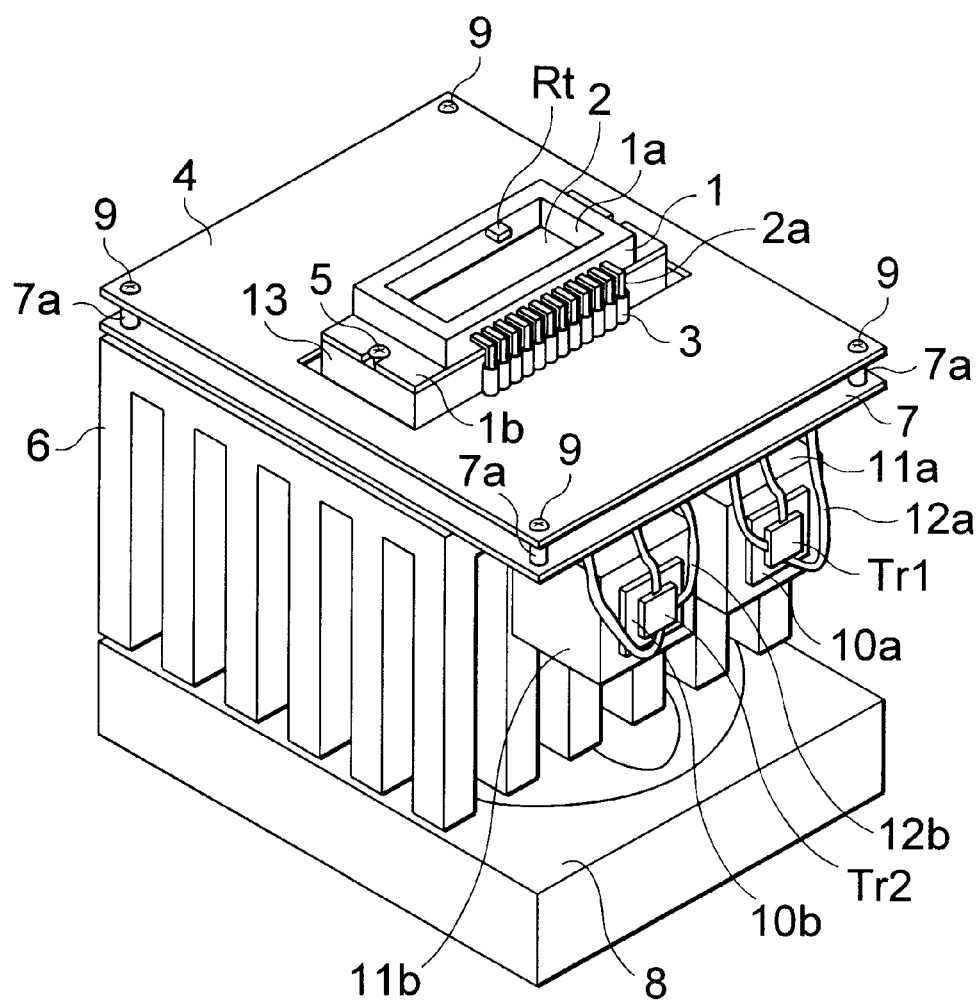
FIG. 1 is a perspective view showing a photodetector head equipped with the optical sensor in accordance with an embodiment of the present invention.
Figure 2:
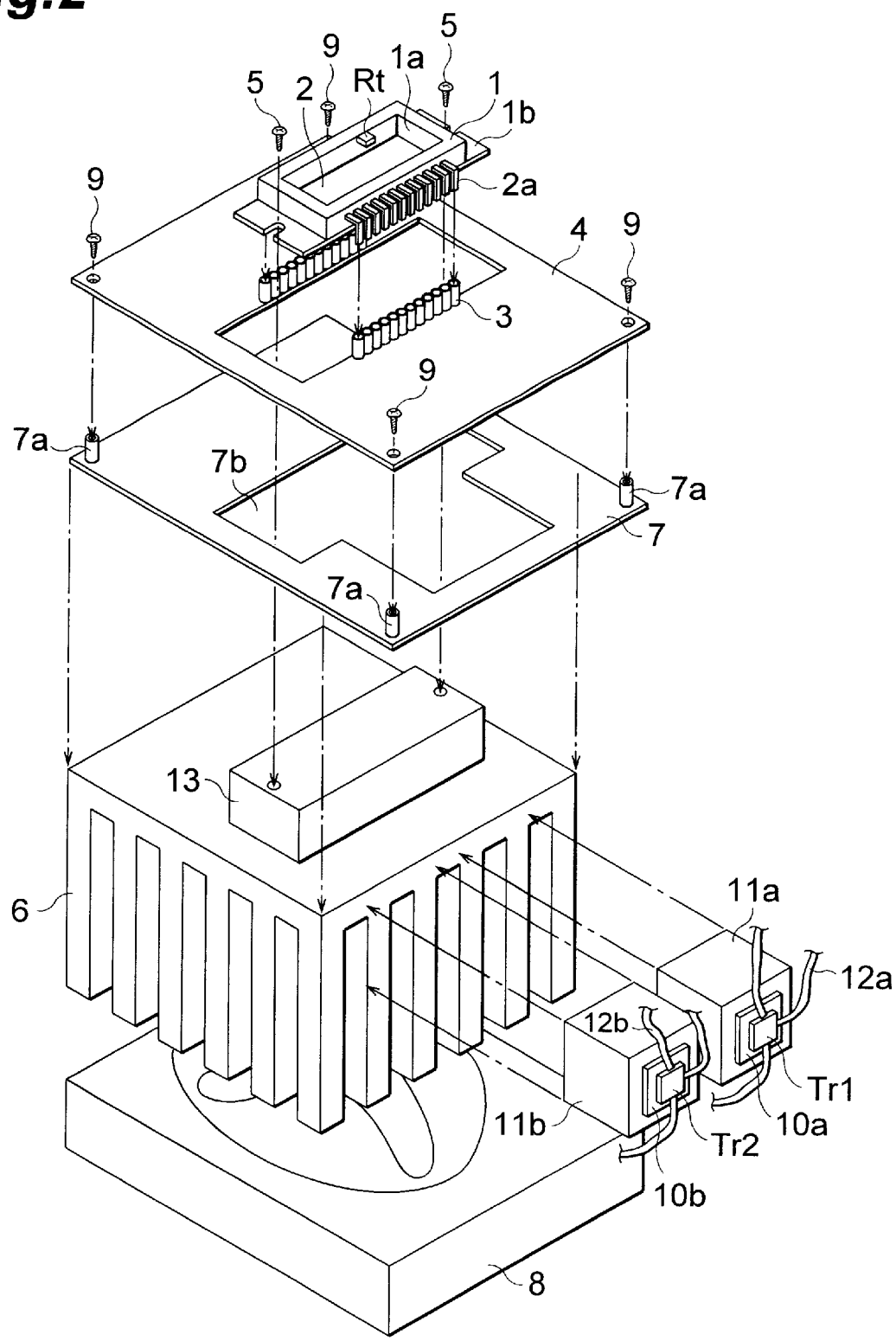
FIG. 2 is an exploded perspective view of the photodetector head.

FIG. 1 is a perspective view showing a photodetector head equipped with the optical sensor in accordance with an embodiment of the present invention, whereas FIG. 2 is an exploded perspective view of the photodetector head, wherein the photodetector head in this embodiment is the one for a CCD image sensor, for example.

In this photodetector head, within a CCD package 1 having an entrance window 1a, opening at the upper part thereof, for receiving light with respect to an object to read out, a CCD device 2 for imaging the object to read out is disposed. The CCD device 2 is equipped with a number of photosensors PD (see FIG. 3) such as photodiodes, for example, arranged in parallel as its photosensitive section. Pins 2a of the CCD device 2 project from side portions of the CCD package 1 and are connected, by way of connectors 3, to a CCD driving circuit board 4 for driving the CCD device 2.

In the vicinity of the CCD device 2 within the CCD package 1, a thermistor Rt, for example, is disposed as a temperature sensor for detecting the temperature of the CCD device 2. The thermistor Rt may be disposed, for example, on a substrate which is provided with the CCD device 2.

Further, a thermoelectric cooling section Pe (see FIG. 3) is disposed at the lower part within the CCD package 1. The thermoelectric cooling section Pe is of a two-stage type comprising a first Peltier device Pe1 on the lower stage and a second Peltier device Pe2 on the upper stage stacked on and secured to the first Peltier device Pe1, in which the CCD device 2 is secured onto the upper-stage second Peltier device Pe2, whereas the lower-stage first Peltier device Pe1 is secured onto a thin sheet-like CCD support plate 1b constituting the lower plate of the CCD package 1. The second Peltier device Pe2 abutting to the CCD package 1 constitutes the Peltier device on the heat absorption side, whereas the first Peltier device Pe1 constitutes the Peltier device on the heat radiation side. In order to improve the heat radiation efficiency, a Peltier device having a higher output (greater current consumption) than that of the second Peltier device Pe2 on the heat absorption side is used as the first Peltier device Pe1 on the heat radiation side. Namely, the Peltier devices having I–V characteristics different from each other are used, respectively.

As shown in FIGS. 1 and 2, by means of a plurality of screws 5 by way of the CCD support plate 1b disposed therebelow, the CCD package 1 is secured onto a radiating block 13 fixed onto a radiating fin 6, or is directly secured onto the radiating fin 6.

Mounted on the radiating fin 6 is a temperature control circuit board 7, having upwardly projecting supports 7a at four corners thereof, formed with a circuit (explained later in detail) for controlling the thermoelectric cooling section Pe. The temperature control circuit board 7 is horizontally positioned as its opening portion 7b opening at its center is loosely fitted over the radiating block 13. The CCD driving circuit board 4 is mounted on the supports 7a of the temperature control circuit board 7 while in a state separated from the temperature control circuit board 7 by the height of the supports 7a. In this state, a plurality of screws 9 engage their corresponding female threads formed in the respective supports 7a, whereby the CCD driving circuit board 4 is fixed with respect to the temperature control circuit board 7.

The radiating fin 6 has its lower part secured onto a cooling fan 8, thus being configured such that the heat of the photosensors PD constituting the CCD device 2 is dissipated outside by way of the thermoelectric cooling section Pe, the radiating fin 6, and the cooling fan 8.

Figure 3:
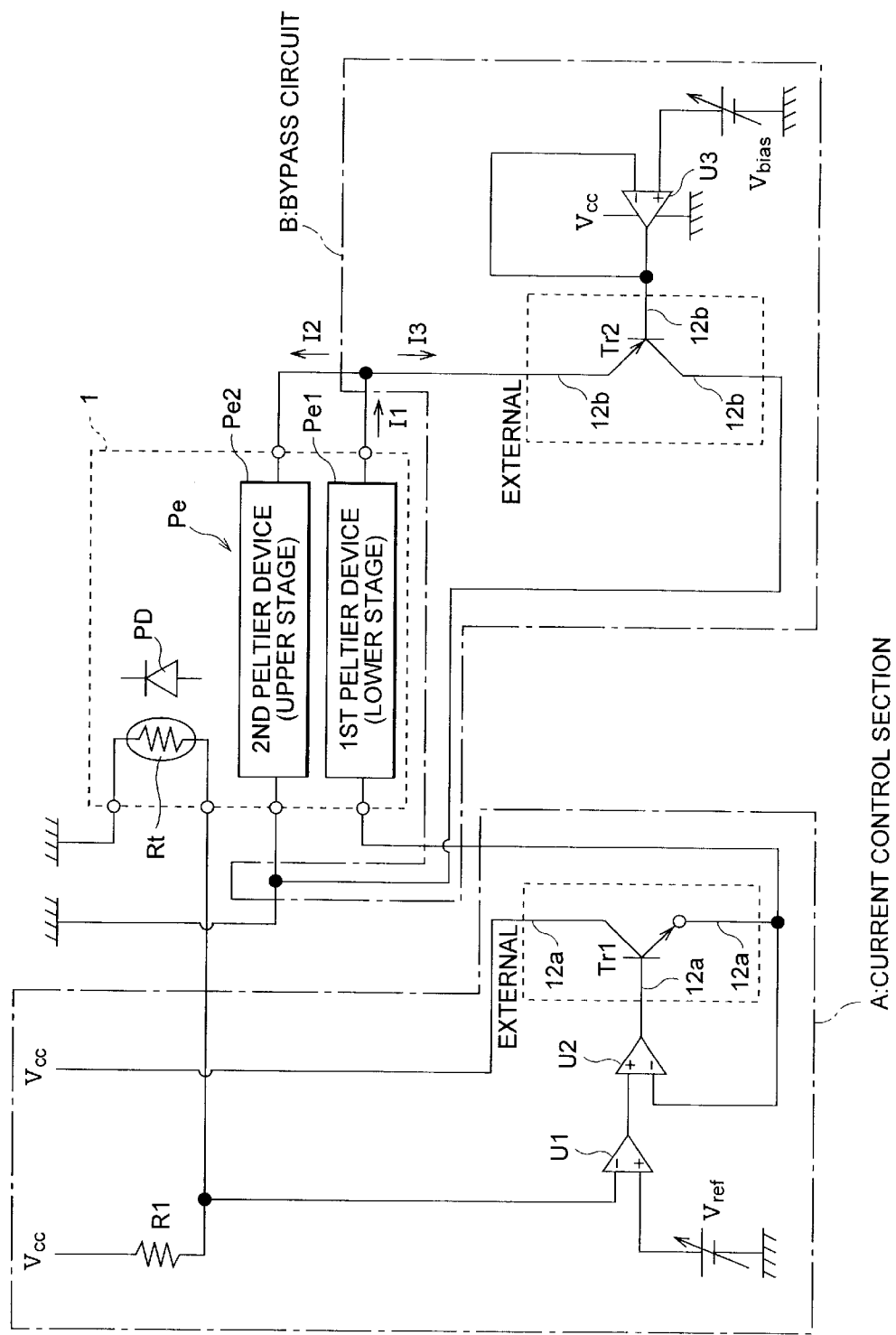
FIG. 3 is a control circuit diagram of a thermoelectric cooling section for cooling the optical sensor.

FIG. 3 is a control circuit diagram of the thermoelectric cooling section Pe for cooling the photosensor PD (CCD device 2), wherein the control circuit is formed on the temperature control circuit board 7 except for a part thereof (the CCD package 1 and power transistors Tr1, Tr2 surrounded by dotted lines in FIG. 3).

In the control circuit, the first Peltier device Pe1 and the second Peltier device Pe2 are connected to each other in series, whereas a current control section A connected to the first Peltier device Pe1 in series and a bypass circuit B connected to the second Peltier device Pe2 in parallel are provided.

The current control section A comprises a $V_{cc}$ power source, a resistor R1 connected between the $V_{cc}$ power source and the thermistor Rt, a first reference voltage $V_{ref}$, operational amplifiers U1, U2, a power transistor Tr1 on the current control section A side, and the like; while being configured so as to supply to the first Peltier device Pe1, according to the output of the thermistor Rt, a driving current I1 which is the most efficient as the driving current for the first Peltier device Pe1.

Namely, the junction between the thermistor Rt and the resistor R1 is connected to one input terminal of the operational amplifier U1, whereas the first reference voltage $V_{ref}$ is connected to the other input terminal. Also, the output terminal of the operational amplifier U1 is connected to one input terminal of the operational amplifier U2, whereas the emitter of the power transistor Tr1 is connected to the other input terminal. The output terminal of the operational amplifier U2 is connected to the base of the power transistor Tr1, whereas the $V_{cc}$ power source is connected to the collector thereof. Further, the input terminal of the first Peltier device Pe1 is connected to the junction between the emitter of the power transistor Tr1 and the other terminal of the operational amplifier U2.

On the other hand, the bypass circuit B comprises a second reference voltage $V_{bias}$, an operational amplifier U3, a power transistor Tr2 on the bypass circuit B side, and the like; while being configured so as to divert an excess current I3 in the driving current I1 in order to supply to the second Peltier device Pe2 a driving current I2 which is the most efficient as the driving current for the second Peltier device Pe2.

Namely, the second reference voltage $V_{bias}$ is connected to one input terminal of the operational amplifier U3 to which the $V_{cc}$ power source is supplied, whereas the output of the operational amplifier U3 is connected to the other input terminal. Also, the output terminal of the operational amplifier U3 is connected to the base of the power transistor Tr2, the series junction between the first Peltier device Pe1 and the second Peltier device Pe2 is connected to the emitter, and the junction between the output terminal of the second Peltier device Pe2 and the ground power source is connected to the collector.

Here, as shown in FIGS. 1 and 2, the power transistor Tr1 on the current control section A side and the power transistor Tr2 on the bypass circuit B side are secured to radiating plates 11a, 11b, made of aluminum or the like, for example, by way of thermal conductors 10a, 10b, made of silicone rubber or the like, for example, respectively. These radiating plates 11a, 11b are secured to a side portion of the radiating fin 6, by way of Teflon or the like, for example, as being thermally isolated therefrom. The power transistors Tr1, Tr2 thus externally provided with respect to the temperature control circuit board 9 are connected to the latter by way of their respective leads 12a, 12b.

In thus configured circuit, when a temperature information voltage from the thermistor Rt is fed into the current control section A, then the latter causes the driving current I1 to flow through the first Peltier device Pe1, whereby the first Peltier device Pe1 is driven at its optimum operating point, i.e., the point at which the cooling performance of the first Peltier device Pe1 is maximized with respect to its consumed power.

At this time, of the driving current I1, the excess current I3 with respect to the second Peltier device Pe2 is diverted into the bypass circuit B, so that the driving current I2 is caused to flow through the second Peltier device Pe2, whereby the second Peltier device Pe2 is driven at its optimum operating point, i.e., the point at which the cooling performance of the second Peltier device Pe2 is maximized with respect to its consumed power.

Thus, in this embodiment, the first Peltier device Pe1 on the heat radiation side and the second Peltier device Pe2, on the heat absorption side, having a current consumption smaller than that of the first Peltier device Pe1 are connected to each other in series, whereas the bypass circuit B for diverting the excess current I3 with respect to the second Peltier device Pe2 is connected to the second Peltier device Pe2 in parallel, whereby the driving current I1 from the current control section A drives the first Peltier device Pe1 at its optimum operating point, and the excess current I3 with respect to the second Peltier device Pe2 in the driving current I1 is diverted into the bypass circuit B, whereby the second Peltier device Pe2 is also driven at its optimum operating point. As a consequence, the cooling efficiency is improved. Also, the first and second Peltier devices Pe1, Pe2 are stacked on each other, i.e., the thermoelectric cooling section Pe is of a stack type, while both Peltier devices Pe1, Pe2 are driven by the single common power source $V_{cc}$ (current control section A), whereby a smaller size is attained.

In this embodiment, the following effects can also be obtained. Namely, since the power transistors Tr1, Tr2 are attached to different radiating plates 11a, 11b disposed outside the temperature control circuit board 7, respectively, the heat generated at each of the power transistors Tr1, Tr2 is efficiently dissipated outside, whereby the cooling efficiency with respect to the photosensor PD is further improved.

When the $V_{cc}$ voltage is set so as to be lowered to a limit voltage at which the power transistor Tr1 on the current control section A side is not saturated, then the overall power consumption can also be suppressed.

Though the invention achieved by the present inventor is specifically explained according to an embodiment in the foregoing, the present invention is not limited to the above-mentioned embodiment and can be modified in various manners within the scope not departing from the gist thereof, as a matter of course. For example, while the above-mentioned embodiment relates to a case where the Peltier devices Pe1, Pe2 are stacked in two stages, the present invention is similarly applicable to cases where they are stacked in three or more stages. In the latter cases, it will be sufficient if all the Peltier devices are connected in series, while bypass circuits which can cause the individual Peltier devices to operate at their respective optimum operating points are connected to all the Peltier devices other than the first Peltier device in parallel.

Also, though the above-mentioned embodiment relates to a case where the photodiode of a CCD image sensor is cooled, without being restricted thereto, the present invention is applicable, in sum, to all the cases where Peltier devices having characteristics different from each other are stacked in a plurality of stages so as to cool photosensors.

Japanese Patent Application Laid-Open No. 9-219475 discloses a power feed circuit for an electronic cooling device in which a plurality of electronic cooling device circuits each including a current limiting resistor connected to a Peltier device in series are connected in parallel, whereas a current control section is connected to the electronic cooling device circuits in parallel, so that the current control section constitutes a bypass circuit, thereby controlling the current flowing through the Peltier devices, and the deviation in characteristic of each Peltier device is corrected by the current limiting resistor. This circuit, however, does not at all disclose the idea and configuration of stacking Peltier devices having characteristics different from each other in a plurality of stages and causing each Peltier device to operate at its optimum operating point in order to attain a smaller size and improved cooling efficiency, and thus is totally different from the present invention. Also, the circuit described in this publication is problematic in that, since the current limiting resistor is used, not only the power is consumed by the resistor but also the resistor itself acts as a heat source, thereby lowering the cooling efficiency, and the circuit is complicated due to the fact that the Peltier devices are connected in parallel. While these problems are overcome by the present invention as mentioned above. That is, as for the present invention, since the Peltier devices are connected to each other in series, as compared with parallel connections, the circuit can be simplified, and a further smaller size can be attained. Furthermore, since no current limiting resistor or the like for correcting the deviation in characteristic of each Peltier device is used, the cooling efficiency is prevented from lowering, and the cooling efficiency is further improved.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An optical sensor device comprising:

an optical sensor;

a temperature sensor disposed proximate said optical sensor device;

a thermoelectric cooling section comprising:

a first Peltier device constructed and arranged to radiate heat generated in said optical sensor; and a second Peltier device constructed and arranged to absorb heat generated in said optical sensor and having a current consumption lower than that of said first Peltier device and being positioned nearer the optical sensor than the first Peltier device, wherein said first and second Peltier devices are stacked, one upon the other and are electrically connected in series;

a current control section configured and arranged to supply a driving current to said first and second Peltier devices; and a bypass circuit electrically connected to said second Peltier device in parallel to divert an excess current in said second Peltier device.

2. An optical sensor according to claim 1, wherein said first Peltier device is driven at an optimum operating point of said first Peltier device by the driving current from said current control section, and wherein said second Peltier device is driven at an optimum operating point of said second Peltier device while the excess current with respect to said second Peltier device is diverted by said bypass circuit.

* * * * *